US012811355B2

(12) United States Patent
Huang et al.

(10) Patent No.: US 12,811,355 B2
(45) Date of Patent: Nov. 24, 2026

(54) SPACE-SAVING RIGID-FLEX STRUCTURES

(71) Applicant: Apple Inc., Cupertino, CA (US)

(72) Inventors: Christopher L. Huang, Daly City, CA (US); Aaron N. Miletich, San Jose, CA (US); Joshua J. Pong, San Jose, CA (US); Min Chul Kim, San Jose, CA (US); Kyle M. Zampaglione, San Jose, CA (US); Matthew T. Craven, San Jose, CA (US)

(73) Assignee: Apple Inc., Cupertino, CA (US)

( * ) Notice: Subject to any disclaimer, the term of this patent is extended or adjusted under 35 U.S.C. 154(b) by 437 days.

(21) Appl. No.: 18/243,827

(22) Filed: Sep. 8, 2023

(65) Prior Publication Data

US 2025/0087953 A1 Mar. 13, 2025

(51) Int. Cl.
*H01R 31/06* (2006.01)
*H01R 13/6581* (2011.01)
*H01R 13/6594* (2011.01)
*H05K 1/14* (2006.01)

(52) U.S. Cl.
CPC ....... *H01R 31/065* (2013.01); *H01R 13/6581* (2013.01); *H01R 13/6594* (2013.01); *H05K 1/148* (2013.01)

(58) Field of Classification Search
CPC ... H01R 31/065; H01R 13/6581; H05K 1/148
USPC ............................................ 439/69, 638, 77
See application file for complete search history.

(56) References Cited

U.S. PATENT DOCUMENTS

| | | | | | |
|---|---|---|---|---|---|
| 5,224,023 | A * | 6/1993 | Smith | G06F 1/184 | 174/254 |
| 5,920,459 | A * | 7/1999 | Weber | H05K 5/006 | 361/752 |
| 5,956,234 | A * | 9/1999 | Mueller | H05K 1/189 | 361/767 |
| 6,552,910 | B1 * | 4/2003 | Moon | H10W 70/611 | 257/770 |
| 7,857,636 | B2 * | 12/2010 | Su | H01R 13/502 | 439/76.1 |
| 7,878,855 | B2 * | 2/2011 | Li | H01R 13/6658 | 439/607.45 |
| 9,385,487 | B2 * | 7/2016 | Wu | H01R 12/73 | |
| 10,231,337 | B2 * | 3/2019 | Johnson | H05K 1/148 | |
| 2014/0073186 | A1 * | 3/2014 | Webb | H01R 12/00 | 29/857 |
| 2016/0174378 | A1 * | 6/2016 | Johnson | H05K 1/148 | 29/830 |

* cited by examiner

*Primary Examiner* — Hae Moon Hyeon
(74) *Attorney, Agent, or Firm* — Kilpatrick Townsend & Stockton LLP

(57) ABSTRACT

An example provides an adapter having a connector with a space-efficient design by incorporating a space-saving rigid-flex structure. The rigid-flex structure can include a first printed circuit board and a second printed circuit board. The first printed circuit board and a second printed circuit board can be joined by a flexible circuit board. The first printed circuit board and the second printed circuit board can be at least roughly aligned with each other and the flexible circuit board can convey power and data signals between electronic components on the first printed circuit board and the second printed circuit board. The flexible circuit board can route signals through a physical 180 degree turn.

19 Claims, 8 Drawing Sheets

SPACE-SAVING RIGID-FLEX STRUCTURES

BACKGROUND

The number of types of electronic devices that are commercially available has increased tremendously the past few years and the rate of introduction of new devices shows no signs of abating. Devices such as tablet computers, laptop computers, desktop computers, all-in-one computers, cell phones, storage devices, wearable-computing devices, portable media players, navigation systems, monitors and other display devices, power adapters, and others, have become ubiquitous.

These electronic devices can communicate and share power over cables having plugs or connector inserts at each end, where the connector inserts can be inserted into connector receptacles in the electronic devices. But a connector insert might not be compatible with a connector receptacle on an electronic device. For example, a connector insert at an end of a cable can convey power and signals consistent with a first specification, and a connector receptacle on an electronic device can convey power and signals consistent with a second specification. Accordingly, it can be desirable to provide an adapter that can translate power and signals conveyed in a manner consistent with the first specification into power and signals conveyed in a manner consistent with a second specification.

One solution is to provide an adapter, which can otherwise be referred to as a dongle. An adapter can include a connector receptacle that is compatible with the first specification and can thus communicate with the connector insert on the cable, a connector inset that is compatible with the second specification and can thus communicate with the connector receptacle on the electronic device, as well as intervening electronic components that can perform the necessary translations.

But these adapters can be large and cumbersome. This size can be particularly annoying when the adapter is attached to a handheld computing device, such as a smartphone. Thus, it can be desirable to provide an adapter having a reduced size. It can also be desirable that these adapters are readily assembled and provide an improved performance.

Thus, what is needed are adapters having connectors having a space-efficient design, are readily assembled, and provide an improved performance.

SUMMARY

Accordingly, embodiments of the present invention can provide adapters having connectors that have a space-efficient design, are readily assembled, and provide an improved performance.

An illustrative embodiment of the present invention can provide an adapter having a connector with a space-efficient design by incorporating a space-saving rigid-flex structure. The rigid-flex structure can include a first printed circuit board and a second printed circuit board. The first printed circuit board and the second printed circuit board can be joined by a flexible circuit board. The first printed circuit board and the second printed circuit board can be at least roughly aligned with each other and the flexible circuit board can convey power and data signals between electronic components on the first printed circuit board and the second printed circuit board. The flexible circuit board can route signals through a physical 180 degree turn.

The flexible circuit board can extend from a first edge of the first printed circuit board to a first edge of the second printed circuit board. The flexible circuit board can extend across a bottom surface of the first printed circuit board and across a top surface of the second printed circuit board. The flexible circuit board can extend across a top surface of the first printed circuit board and across a top surface of the second printed circuit board. The flexible circuit board can extend across a bottom surface of the first printed circuit board and across a bottom surface of the second printed circuit board. The flexible circuit board can extend through intermediate layers of either or both the first printed circuit board and the second printed circuit board.

This rigid-flex structure allows electronic components, circuits, and other connector structures to be placed on one, two, three, or four printed circuit board sides. For example, where the first printed circuit board is positioned as a terrace board over the second printed circuit board, or base board, electronic components can be placed on a bottom of the base board, a top of the terrace board, and between terrace board and the base board in a terraced space, that is, on the bottom of the terrace board and the top of the base board. In these and other embodiments of the present invention, electronic components on the bottom of the base board and the top of the terrace board can be encapsulated, though some of all of these devices can be unencapsulated. Components that should not be encapsulated, for example to avoid stress, can be placed in the terraced space, though some or all of the terraced space can be encapsulated as well in these and other embodiments of the present invention.

Vertical spacing between the terrace board and base board can be controlled, set, or determined using various structures. For example, the connector can include a receptacle assembly that includes a receptacle shield around a number of contacts that are electrically connected to traces on either or both the base board and the terrace board. The receptacle assembly can include tabs or standoffs extending away from the receptacle shield. The tabs or standoffs can provide spacing and support for the base board and the terrace board. The height of the standoffs can determine or set the vertical spacing between the base board and the terrace board. That is, the standoffs can be in contact with both the base board and the terrace board such that a height of the standoffs is the spacing between the base board and the terrace board. The standoffs can have pins extending upwards and pins extending downwards. These pins can be fit in and soldered to corresponding openings in the base board and the terrace board. The pins can have chamfered leading edges to help to align the boards to each other during assembly. One of the holes in one of the boards can be wider to facilitate the insertion of a corresponding pin during assembly.

While the vertical spacing between boards at a first end of the connector can be set using these receptacle assembly standoffs, other techniques can be used to set the vertical spacing between boards at a second end of the connector. For example, a crimp piece can have tabs or standoffs extending away from a cable. The standoffs can have a first portion to be soldered to ends of the base board and the terrace board, as well as portions that are between and contact the base board and the terrace board to determine or set the spacing between the base board and the terrace board.

Vertical spacing between a base board and a terrace board of a space-saving rigid-flex structure can be controlled using other structures, such as interposers. These interposers can be used when the space-saving rigid-flex structure is incorporated into a connector as well as other types of electronic devices. The interposers can include a number of pins that are soldered to a top of the base board and a bottom of the terrace board. The pins can be housed in a plastic molding, an FR-4 board, or other dielectric material.

As an example, where a flexible circuit board extends from a first edge of the base board to a first edge of the terrace board, an interposer can be located along a second edge of the base board and a second edge of the terrace board. An interposer can be located around an outer edge of the base board and the terrace board such that the interposer circumferentially surrounds the terraced space. In these and other embodiments of the present invention, more than one interposer can be used. For example, a first interposer can be located along the first edge of the base board and the first edge of the terrace board, while a second interposer can be located along the second edge of the base board and the second edge of the terrace board. In these and other embodiments of the present invention, an interposer can be placed along or near an outside edge of the base board and extend to the terrace board and be located along or near an outside edge. Interposers can also be routed through the terraced space away from the edges, for example to provide shielding for electronic components in the terraced space.

These interposers can form a ground path between the base board and the terrace board. These interposers can also or instead convey other power supplies, data signals, bias lines, or other voltages or currents between the base board and the terrace board. It can be advantageous to use the pins of an interposer to convey a power supply such as ground given the relatively low-impedance of the pins. When a power supply is conveyed by an interposer, the interposer can act as a shield for electrical components in the terraced space. In these and other embodiments of the present invention, when signals are conveyed using interposers, it can be desirable to include redundant paths to compensate for pin breakage. The desirability of this redundancy highlights the usefulness providing signals using the flexible circuit board and relegating the interposers to providing shielding.

Vertical spacing between the terrace board and base board can be controlled using various post and shield structures. For example, corner posts extending between the base board and the terrace board can be placed in corners of the base board and the terrace board. Side posts can be placed along sides of the base board and the terrace board. These posts can be soldered or attached to the base board and the terrace board using surface-mount technology or other technique. Shield structures can extend between two of either side posts or corner posts to provide shielding for all or a portion of the terraced space. The shields can be soldered to either or both the base board and the terrace board. The shield structures can extend from a top of the base board to a bottom of the terrace board. In these and other embodiments of the present invention, the shield structures can be thin thereby providing a space-efficient shield.

Additional space saving techniques can be provided by these and other embodiments of the present invention. For example, a wire comb can be used where the wire comb is positioned in the terraced space in a position where a limited amount of board space is consumed. A crimp structure for the cable can include standoffs that extend away from the cable and solder to rear sections of the base board and the terrace board such that only a limited amount of board space is consumed. Portions of these standoffs can be positioned between the base board and the terrace board to provide support and spacing.

Additional space saving can be achieved by including a micro-coaxial cable (microcoax) in the adapter cable and then using the shield of the microcoax to convey a signal. The shield and the center wire of the microcoax can be soldered to contacts that are positioned in line with the coaxial cable. This can eliminate a conductor from the adapter cable and can reduce a width of a region consumed by contacts or pads for terminating the conductors. In these and other embodiments of the present invention, a connector can receive a Lightning™ input and provide a Universal Serial Bus (USB) Type-C output. In this case, the center wire of the microcoax can convey a CC signal while the outer shield or braiding can convey a VCON power signal. This allows consolidation of the conductors to six, which can be efficiently fit around a strain relief that can be located in the center of the adapter cable. The remaining five conductors can be used to convey two USB signals, two quick-disconnect USB signals, and a VBUS power supply, or other signals or combination of signals. Drain wires and a braiding or shield of the adapter cable can be included to convey ground. Six drain wires can be used and they can each be positioned between two of the conductors and away from the center strain relief. Fibers, such as aramid fibers, can be placed in the 12 locations between the drain wires and the six conductors. Additional fibers can be routed through centers of each of the six conductors.

Additional space savings can be achieved by utilizing space-saving side ground contacts in a connector. For example, where a connector receives a Lightning™ input, these space-saving side ground contacts can help to reduce a width of the receptacle. These space-saving side ground contacts can be reinforced with tabs that extend along an outward facing side of the side ground contacts. These tabs can be a portion of a housing for connector. The tabs can limit a possible deflection of the side ground contacts, thereby allowing the receptacle to have a reduced width.

The space-saving rigid-flex structures used in these and other embodiments of the present invention can be formed in various ways. For example, the flexible circuit board can include copper or other conductive layers that can be patterned, each on one side of a polyimide or other flexible layer. These layers can extend through the base board and the terrace board. The base board and terrace board can each have additional layers above and below the flexible circuit board layers. The base board and terrace board can have the same or different layers as compared to each other and they can have the same or different layers on each side of the flexible circuit board layers. For example, the base board and terrace board can have fiberglass, prepreg, or other dielectric layers above, below, or both above and below the flexible circuit board layers. These layers can support copper or other conductive layers. The base board and terrace board can thus be built up of alternating dielectric and conductive layers. The flexible circuit board can have a coverlay over the conductive layers of the flexible circuit board, where the coverlay is attached to the conductive layers of the flexible circuit board with an adhesive. The base board and terrace board can have layers of soldermask over their top and bottom conductive layers. Vias can be located throughout the space-saving rigid-flex board to provide signal routing. The additional dielectric layers and conducive layers can be formed as the base board and terrace board during manufacturing. In these and other embodiments of the present invention, the additional dielectric layers and conducive layers can be formed over the flexible circuit board layers, and then routed to form the flexible circuit board. Following the routing, the coverlay can be applied to the top and bottom of the flexible circuit board.

In these and other embodiments of the present invention, the base board and terrace board can be formed of FR-4 layers having plated metallized layers etched to form contacts and traces. These and other embodiments of the present invention can include a base board and a terrace board that include metalized or conductive layers, prepreg layers, FR-4 layers, and other layers.

In these and other embodiments of the present invention, the connectors, such as a connector for an adapter, can be manufactured in various ways. For example, the space-saving rigid-flex structure can be placed in an open position, where the base board, flexible circuit board, and terrace board lie flat and parallel to each other. Components can be attached to either or both sides of the base board and the terrace board. A receptacle assembly can be attached to the terrace board. Conductors of the cable can be attached to contacts or pads on the terrace board. One or more sides of either or both the base board and the terrace board can be encapsulated to prevent damage during further assembly. The cable strain relief and its standoffs can be attached to ends of the base board and the terrace board. The terrace board can be folded over the base board. Front plates, moldings, and housings can be positioned or formed around the receptacle assembly, space-saving rigid-flex structure, and strain relief.

In these and other embodiments of the present invention, the adapter can be used to transfer power to an electronic device. The adapter can also transfer specific types of data, such as audio data. The adapter can also transfer other communications data between electronic devices. The adapter can also transfer other types of data between electronic devices. The adapter can transfer a combination of some or all of these and other types of data.

In various embodiments of the present invention, receptacle shields, cable crimps, standoffs, contacts, and other conductive portions of an adapter can be formed by stamping, metal-injection molding, machining, micro-machining, 3-D printing, or other manufacturing process. The conductive portions can be formed of stainless steel, steel, copper, copper titanium, phosphor bronze, or other material or combination of materials. They can be plated or coated with nickel, gold, or other material. The nonconductive portions, such as housings and other structures can be formed using injection or other molding, 3-D printing, machining, or other manufacturing process. The nonconductive portions can be formed of silicon or silicone, rubber, hard rubber, plastic, nylon, liquid-crystal polymers (LCPs), ceramics, or other nonconductive material or combination of materials. The printed circuit boards used can be formed of FR-4 or other material.

Embodiments of the present invention can provide adapters that can connect to various types of devices, such as audio devices, portable computing devices, tablet computers, desktop computers, laptops, all-in-one computers, wearable computing devices, cell phones, smart phones, media phones, storage devices, portable media players, navigation systems, monitors, power supplies, video delivery systems, adapters, remote control devices, chargers, and other devices. These adapters can provide interconnect pathways for signals that are compliant with various specifications or standards such as one of the Universal Serial Bus (USB) specifications including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention can provide adapters that can be used to provide a reduced set of functions for one or more of these specifications or standards. In various embodiments of the present invention, these interconnect paths provided by these adapters can be used to convey power, ground, signals, test points, and other voltage, current, data, or other information.

Various embodiments of the present invention can incorporate one or more of these and the other features described herein. A better understanding of the nature and advantages of the present invention can be gained by reference to the following detailed description and the accompanying drawings.

BRIEF DESCRIPTION OF THE DRAWINGS

FIG. 6A illustrates a portion of an electronic device comprising a rigid-flex structure and an interposer according to an embodiment of the present invention, while

DESCRIPTION OF ILLUSTRATIVE EMBODIMENTS

Electronic devices can communicate and share power over cables having plugs or connector inserts at each end, where the connector inserts can be inserted into connector receptacles in the electronic devices. But a connector insert on a cable might not be compatible with a connector receptacle on an electronic device. For example, a connector insert at an end of a cable can convey power and signals consistent with a first specification, while a connector receptacle on an electronic device can convey power and signals consistent with a second specification. Accordingly, it can be desirable to provide an adapter that can translate power and signals conveyed in a manner consistent with the first specification to power and signals conveyed in a manner consistent with a second specification.

One solution is to provide an adapter, which can otherwise be referred to as a dongle. The adapter can include a connector receptacle that is compatible with the first specification and can thus communicate with the connector insert on the cable, a connector inset that is compatible with the second specification and can thus communicate with the connector receptacle on the electronic device, as well as intervening electronic components to perform the necessary translations.

One use of such an adapter can be when music or other audio is provided by a phone or other handheld device to speakers, headphones, amplifiers, and other electronic device. The electronic device can be connected to a cable terminating in a connector insert consistent with a first specification or standard. The phone or other handheld device can have a connector receptacle that is consistent with a second specification. The phone or other handheld device can be connected to the cable through an adapter that has a connector receptacle that is consistent with the first specification and a connector insert that is consistent with the second specification. But it can be undesirable to hold a phone or other handheld device connected to the cable through a bulky adapter. That is, it can be desirable that the adapter have a form factor that is not significantly different from the cable itself. Accordingly, embodiments of the present invention can provide adapters having a narrow and reduced-size form factor. An example is shown in the following figure.

Figure 1:
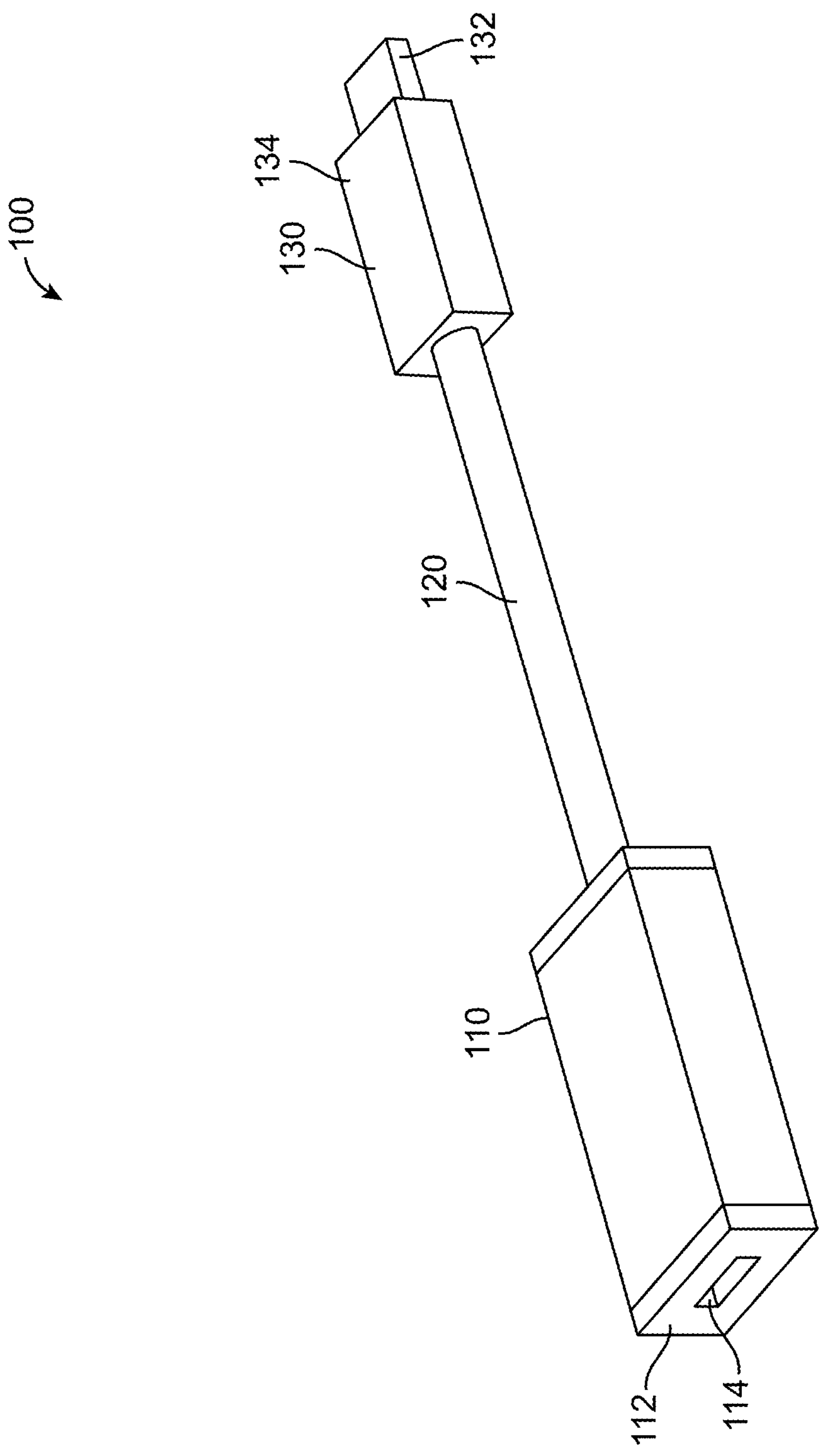
FIG. 1 illustrates an adapter according to an embodiment of the present invention.

FIG. 1 illustrates an adapter according to an embodiment of the present invention. This figure, as with the other included figures, is shown for illustrative purposes and does not limit either the possible embodiments of the present invention or the claims.

Adapter 100 can include connector 110, adapter cable 120, and connector 130. Connector 110 can include face plate 112 having an opening for connector receptacle 114. Connector 130 can include connector insert 132 extending from housing 134.

A user might have a speaker, a set of headphones, an amplifier, and other electronic device connected to a cable having a connector insert (not shown) that is compatible with a first specification. The user might further have a phone or other handheld device having a connector receptacle (not shown) that is consistent with a second specification, which might not be directly compatible with the first specification. Accordingly, adapter 100 can have connector 110 having connector receptacle 114 that is consistent with the first specification, and connector 130 having connector insert 132 that is consistent with the second specification. In this way, the cable having a connector insert can be plugged into connector receptacle 114 and connector insert 132 can be plugged into the connector receptacle on the phone or other handheld device. Translation circuitry in adapter 100 can allow the phone or other handheld device and the electronic device to communicate.

In this example, adapter 100 can provide a path for audio signals. In these and other embodiments of the present invention, the adapter can be used to transfer power to an electronic device. The adapter can also transfer specific types of data, such as audio data. The adapter can also transfer other communications data between electronic devices. The adapter can also transfer other types of data between electronic devices, or any combination of the above power and data signals can be transferred using adapter 100.

In this example, connector 110 can have connector receptacle 114 that is consistent with the Lightning™ specification and connector 130 can have connector insert 132 that is a Universal Serial Bus Type-C compatible connector insert. Adapter 100 can thus allow legacy Lightning™ devices to communicate with newer Universal Serial Bus Type-C compatible devices. In these and other embodiments of the present invention, connector receptacle 114 can be consistent with other specifications, such as Universal Serial Bus, Universal Serial Bus Type-C, MagSafe™, or other specification, while connector insert 132 can be consistent with other specifications, such as Universal Serial Bus, Lightning™, MagSafe™, or other specification.

The translation circuitry and other electronics for adapter 100 can be placed in either or both connector 110 and connector 130. In the examples below, these electronics can be at least primarily in connector 110, thought in these and other embodiments of the present invention, these electronics can be primarily in connector 130. An example is shown in the following figure.

Figure 2:
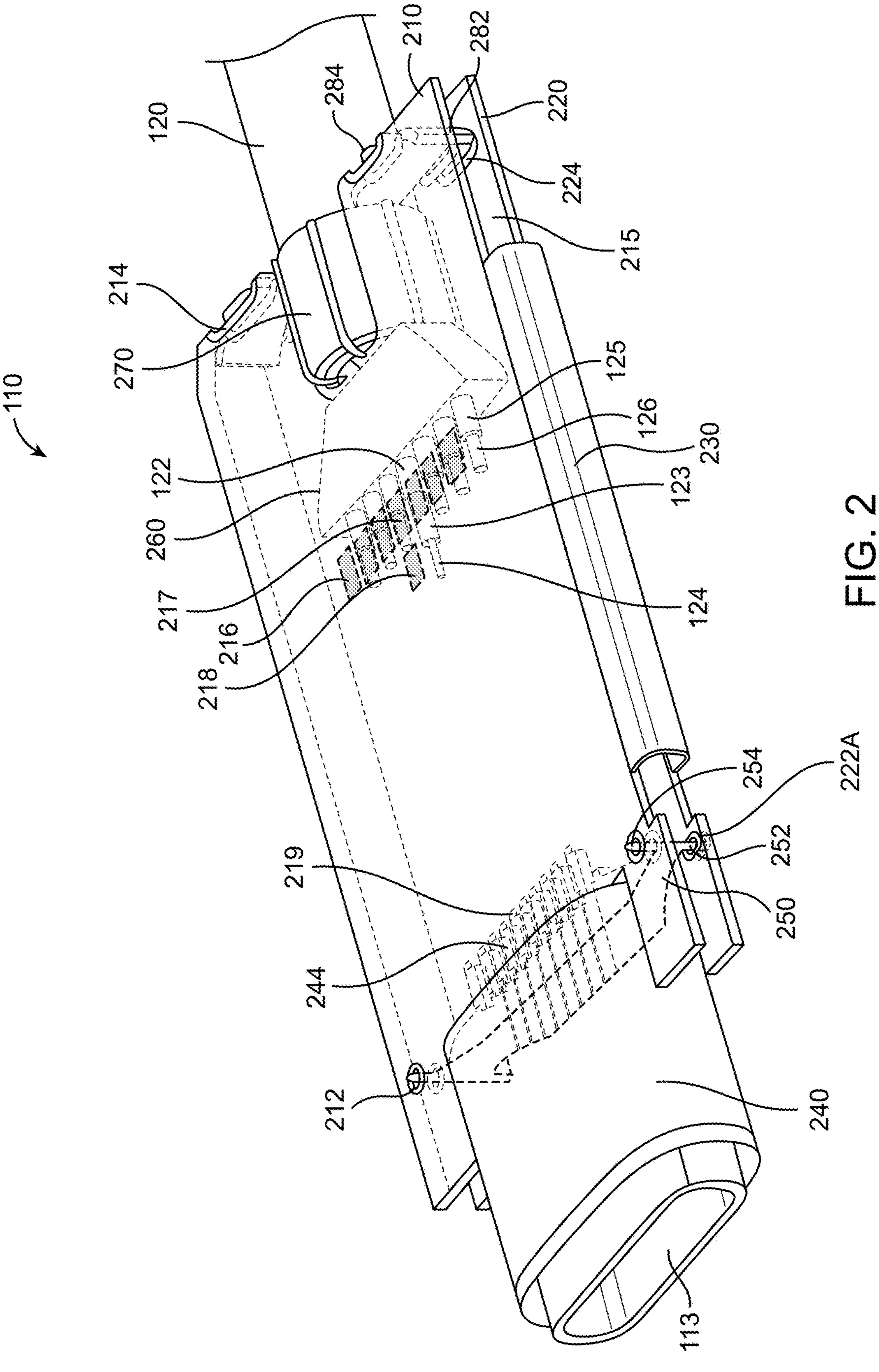
FIG. 2 illustrates a connector for the adapter of FIG. 1 according to an embodiment of the present invention.

FIG. 2 illustrates a connector for the adapter of FIG. 1 according to an embodiment of the present invention. Connector 110 can have a space-efficient design by incorporating a space-saving rigid-flex structure. The rigid-flex structure can include first printed circuit board 210 and second printed circuit board 220. First printed circuit board 210 and second printed circuit board 220 can be joined by flexible circuit board 230. First printed circuit board 210 and second printed circuit board 220 can be at least roughly vertically aligned with each other. Flexible circuit board 230 can convey power and data signals between electronic components 410 (shown in FIG. 4) on first printed circuit board 210 and electronic components 410 on second printed circuit board 220. Flexible circuit board 230 can route power and signals through a physical 180 degree turn between first printed circuit board 210 and second printed circuit board 220.

Flexible circuit board 230 can extend from a first edge of first printed circuit board 210 to a first edge of second printed circuit board 220. Flexible circuit board 230 can extend across a bottom surface of first printed circuit board 210 and across a top surface of second printed circuit board 220. Flexible circuit board 230 can extend across a top surface of first printed circuit board 210 board and across a top surface of second printed circuit board 220. Flexible circuit board 230 can extend across a bottom surface of first printed circuit board 210 and across a bottom surface of second printed circuit board 220. Flexible circuit board 230 can extend through intermediate layers of either or both first printed circuit board 210 and second printed circuit board 220. Flexible circuit board 230 can extend along the entire, or portions of, edges of first printed circuit board 210 and second printed circuit board 220 from a first end at or near receptacle assembly 240 to a second end at or near adapter cable 120.

This rigid-flex structure can allow electronic components 410, circuits, and other connector structures to be placed on one, two, three, or four printed circuit board sides. For example, where first printed circuit board 210 is positioned as terrace board 210 over second printed circuit board 220, or base board 220, electronic components 410 can be placed on a bottom of base board 220, a top of terrace board 210, and between terrace board 210 and base board 220 in terraced space 215, that is, on the bottom of terrace board 210 or the top of base board 220. In these and other embodiments of the present invention, electronic components 410 on the bottom of base board 220 and the top of terrace board 210 can be encapsulated. Electronic components 410 that should not be encapsulated, for example to avoid stress, can be placed in terraced space 215, though electronic components 410 in the terraced space 215 can be encapsulated as well, and electronic components 410 on the bottom of base board 220 and the top of terrace board 210 can remain unencapsulated in these and other embodiments of the present invention.

Vertical spacing between terrace board 210 and base board 220 can be controlled using various structures. For example, connector 110 can include receptacle assembly 240 supporting a number of contacts 244 that are soldered to pads 219 on an underside of terrace board 210, which can electrically connect to traces (not shown) on either or both base board 220 and terrace board 210. Receptacle assembly 240 can include opening 113 for accepting a corresponding connector insert (not shown.) Contacts 244 in receptacle assembly 240 can mate with corresponding contacts (not shown) in the corresponding connector insert. Receptacle assembly 240 can include tabs or standoffs, referred to here as standoffs 250, extending towards sides of connector 110. Standoffs 250 can provide spacing and support for base board 220 and terrace board 210. The height of standoffs 250 can thus determine the vertical spacing between base board 220 and terrace board 210. That is, standoffs 250 can be between and in contact with base board 220 and terrace board 210 such that a height of standoffs 250 determine a vertical spacing between base board 220 and terrace board 210. Tabs or standoffs 250 can include pins 254 extending upwards and pins 252 extending downwards. Pins 254 can be fit in and soldered to corresponding openings 212 in terrace board 210, while pins 252 can be fit in and soldered to corresponding opening 222A and corresponding opening 222 (shown in FIG. 4) in base board 220. Pins 252 and pins 254 can have chamfered leading edges to help to align terrace board 210 and base board 220 to each other during assembly. Opening 222A can be wider to facilitate the insertion of corresponding pin 252 during assembly.

While the vertical spacing between base board 220 and terrace board 210 at a first end of connector 110 can be set using standoffs 250, other techniques can be used to set the vertical spacing between base board 220 and terrace board 210 at a second end of connector 110. For example, crimp piece 280 (shown in FIG. 3) can have tabs or standoffs, referred to here as standoffs 282, extending away from adapter cable 120. Standoffs 282 can each have a first standoff portion 284 to be soldered to solder regions 224 and 214 at ends of base board 220 and terrace board 210, respectively, as well as sections 286 and 288 (shown in FIG. 3) that are between and in contact with base board 220 and terrace board 210, and thereby determine the spacing between the ends of base board 220 and terrace board 210. Crimp piece 280 can be crimped around adapter cable 120 to secure adapter cable 120 to connector 110.

Additional space saving techniques can be provided by these and other embodiments of the present invention. For example, wire comb 260 can be used. Wire comb 260 can be formed around portions near ends of conductors 125 and microcoax 122. Wire comb 260 can be positioned in terraced space 215 such that a limited amount of board space is consumed. As described above, crimp piece 280 for adapter cable 120 can include tabs or standoffs 282 that extend away from adapter cable 120 and solder to rear sections of base board 220 and terrace board 210 at pads or solder regions 224 and 214, respectively, such that only a limited amount of board space is consumed.

Additional space saving can be achieved by including micro-coaxial cable (microcoax) 122 in adapter cable 120 and then using braiding or shield 123 of microcoax 122 to convey a signal. Braiding or shield 123 and center wire 124 of microcoax 122 can be soldered to contact or pad 217 and contact or pad 218, respectively, that are positioned in line with microcoax 122. This can eliminate a conductor from adapter cable 120 and can reduce a width of a region consumed by contacts or pads 216 for terminating conductors of adapter cable 120. In these and other embodiments of the present invention, connector 110 can receive a Lightning™ input and provide a Universal Serial Bus (USB) Type-C output. In this case, center wire 124 of the microcoax 122 can convey a Communication Channel (CC) signal while braiding or shield 123 can convey a Voltage Connect (VCON) power signal, though these signal allocations can be reversed. This allows consolidation of the conductors to six, including five conductors 125 and microcoax 122, which can efficiently fit around a strain relief (not shown) that can be located in the center of adapter cable 120. The five conductors 125 can be used to convey two USB signals, two quick-disconnect USB signals, and a Voltage Bus (VBUS) power supply, though other signals and combination of signals can be conveyed by conductors in these and other embodiments of the present invention. Drain wires (not shown) and a shield of the adapter cable (not shown) can be included to convey ground. Six drain wires can be used and they can each be positioned between two of the conductors and away from the center strain relief. Fibers (not shown), such as aramid fibers, can be placed in the 12 locations between drain wires and the six conductors. Additional fibers (not shown) can be routed through centers of each of the six conductors. Shield or braiding 270 can be pulled back over and soldered to crimp piece 280. Further details of crimp piece 280 is shown in the following figure.

Figure 3:
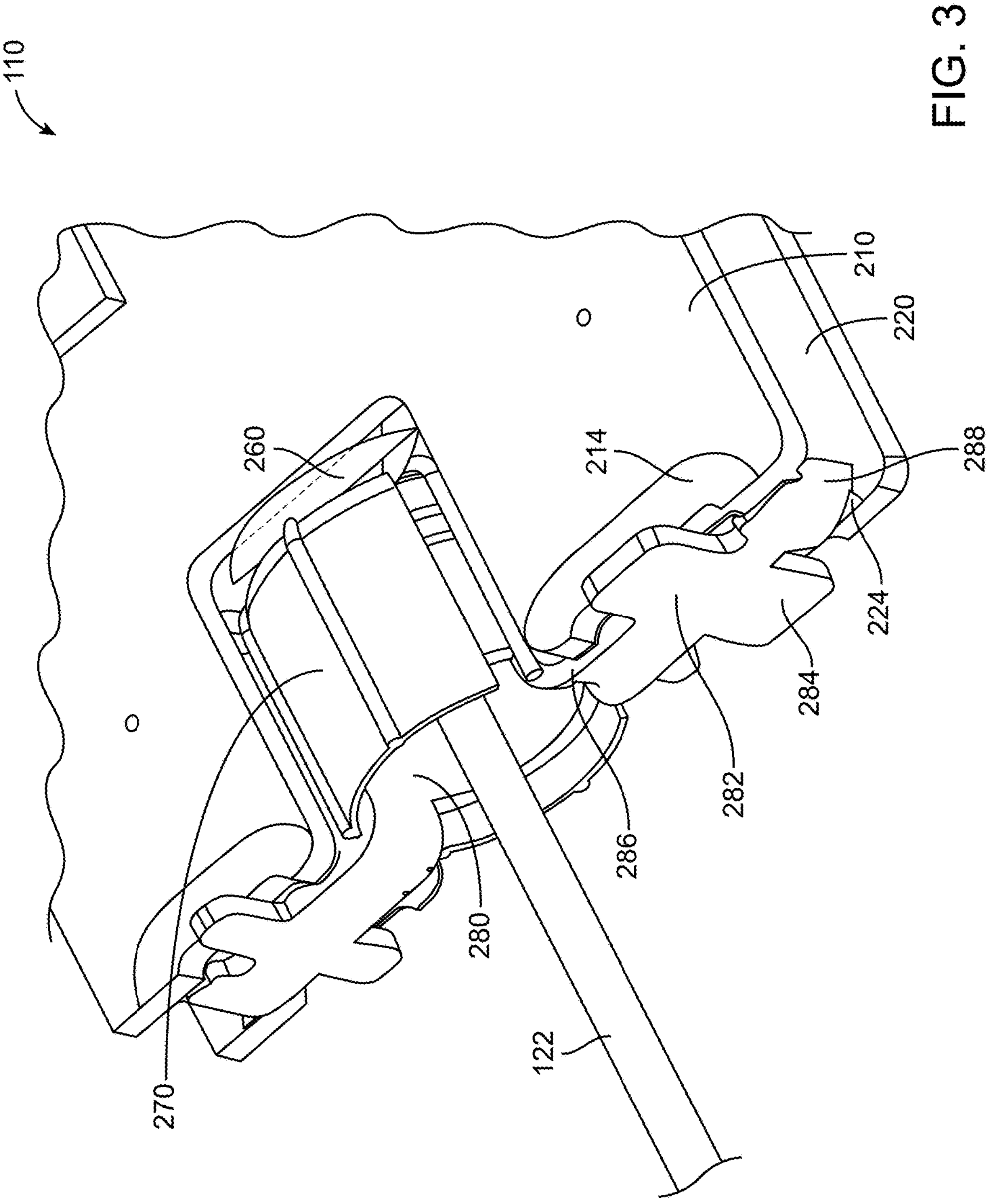
FIG. 3 illustrates a portion of the connector of FIG. 2.

FIG. 3 illustrates a portion of the connector of FIG. 2. This portion of connector 110 can include terrace board 210 and base board 220 spaced apart and fastened to each other by crimp piece 280. Crimp piece 280 can encircle an end of adapter cable 120 (shown in FIG. 1.) Braiding 270 of adapter cable 120 can be pulled back over and soldered to crimp piece 280. Crimp piece 280 can include tabs or standoffs 282 extending away from adapter cable 120. Standoffs 282 can each have two standoff portions 284 to be soldered to ends of base board 220 and terrace board 210. Standoff portions 284 can be soldered to terrace board 210 at solder regions 214 and to base board 220 at solder regions 224. This can mechanically attach terrace board 210 to base board 220. Standoffs 282 can include section 286 and section 288. Section 286 and section 288 can be placed between the ends of base board 220 and terrace board 210. Section 286 and section 288 of standoffs 282 can be attached to and between the ends of terrace board 210 and base board 220 and can accordingly determine a spacing between them. This configuration can provide spacing and support for base board 220 and terrace board 210 in a space-efficient manner. Wire comb 260 can support and position ends of microcoax 122 and conductors 125 (shown in FIG. 2) in adapter cable 120.

Figure 4:
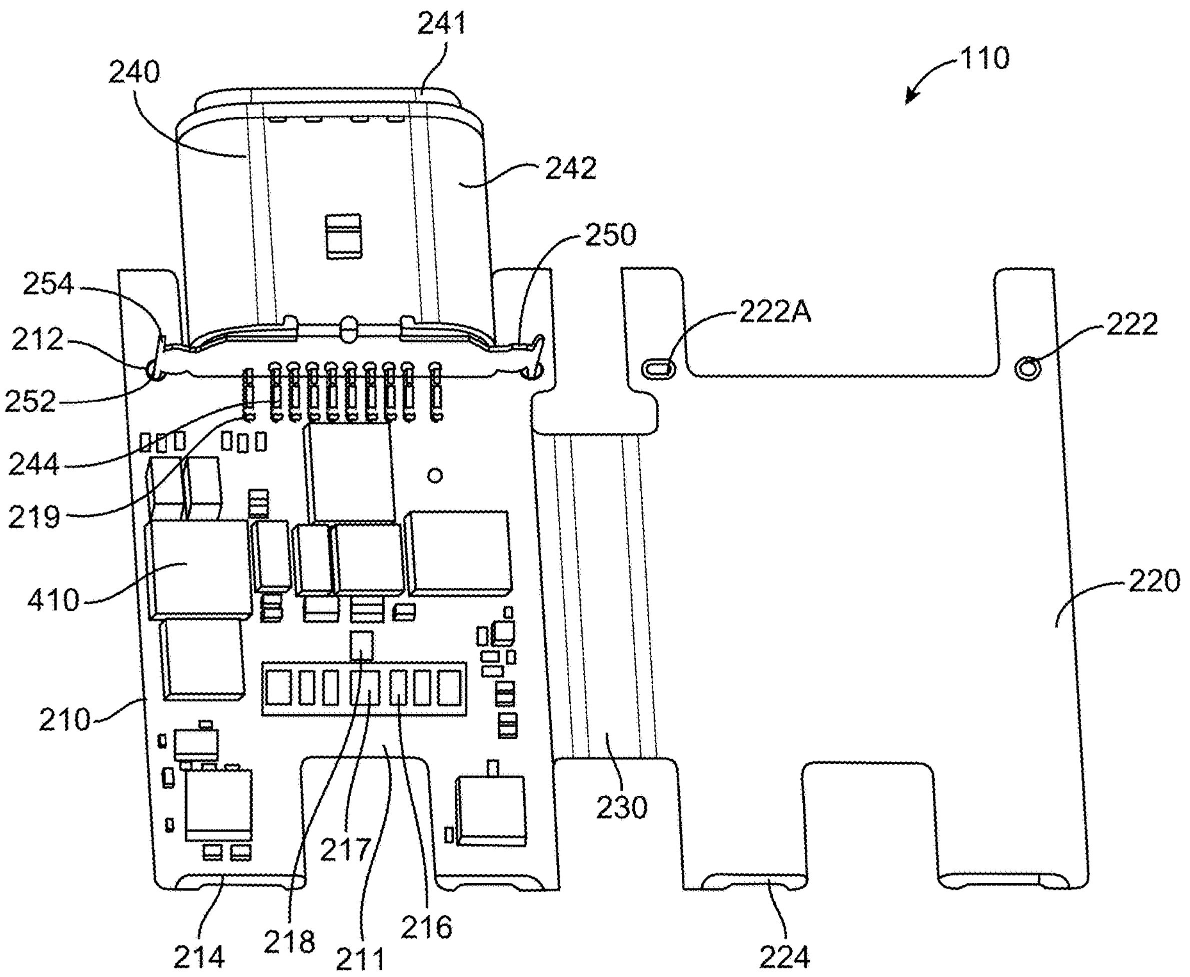
FIG. 4 illustrates a space-saving rigid-flex structure that can be used in the connector of FIG. 2.

FIG. 4 illustrates a space-saving rigid-flex structure that can be used in the connector of FIG. 2. Connector 110 can include a rigid-flex structure that includes terrace board 210, base board 220, and flexible circuit board 230 is shown in an opened position as it might appear during manufacturing. Contacts 244 of receptacle assembly 240 can be soldered to pads 219 on terrace board 210. Receptacle assembly 240 can include shield 242 around housing 241, which can support contacts 244. Pins 252 on standoffs 250 can be inserted in and soldered to openings 212 in terrace board 210. The five conductors 125 of adapter cable 120 (shown in FIG. 1) can be soldered to five of the six pads 216 on terrace board 210. Center wire 124 and braiding or shield 123 of microcoax 122 can be soldered to pad 218 and pad 217, respectively. Various components 410 can be placed on one or both sides of terrace board 210 and on one or more sides of base board 220. Components 410 can be encapsulated, though some components 410 can be susceptible to strain caused by encapsulation and can therefore be unencapsulated. For example, components 410 in terraced space 215 (shown in FIG. 2) can be unencapsulated, though some or all such components 410 can be encapsulated to prevent damage when terrace board 210 and base board 220 are folded together.

Before folding terrace board 210 and base board 220 together, adapter cable 120 can be attached. For example, wire comb 260 can be placed in region 211 of terrace board

210. Wires 126 of conductors 125 can be soldered to pads 216, while braiding or shield 123 of microcoax 122 and center wire 124 of microcoax 122 can be soldered to pads 217 and 218, respectively. Crimp piece 280 (shown in FIG. 3) can be fit over adapter cable 120. Braiding 270 (shown in FIG. 3) of adapter cable 120 can be folded over and soldered to crimp piece 280.

During assembly, terrace board 210 and base board 220 can be folded together. For example, base board 220 can be folded over terrace board 210. Opening 222 and opening 222A can be aligned with and soldered to pins 254 on standoffs 250 of receptacle assembly 240. Opening 222A can have an elongated or wider shape to compensate for the narrow radius through which opening 222A travels when aligning with its corresponding pin 254. Standoffs 282 of crimp piece 280 (shown in FIG. 3) can be soldered to solder region 214 of terrace board 210 and solder region 224 of base board 220. These and other assembly steps can be performed in various sequences in these and other embodiments of the present invention.

Figure 5:
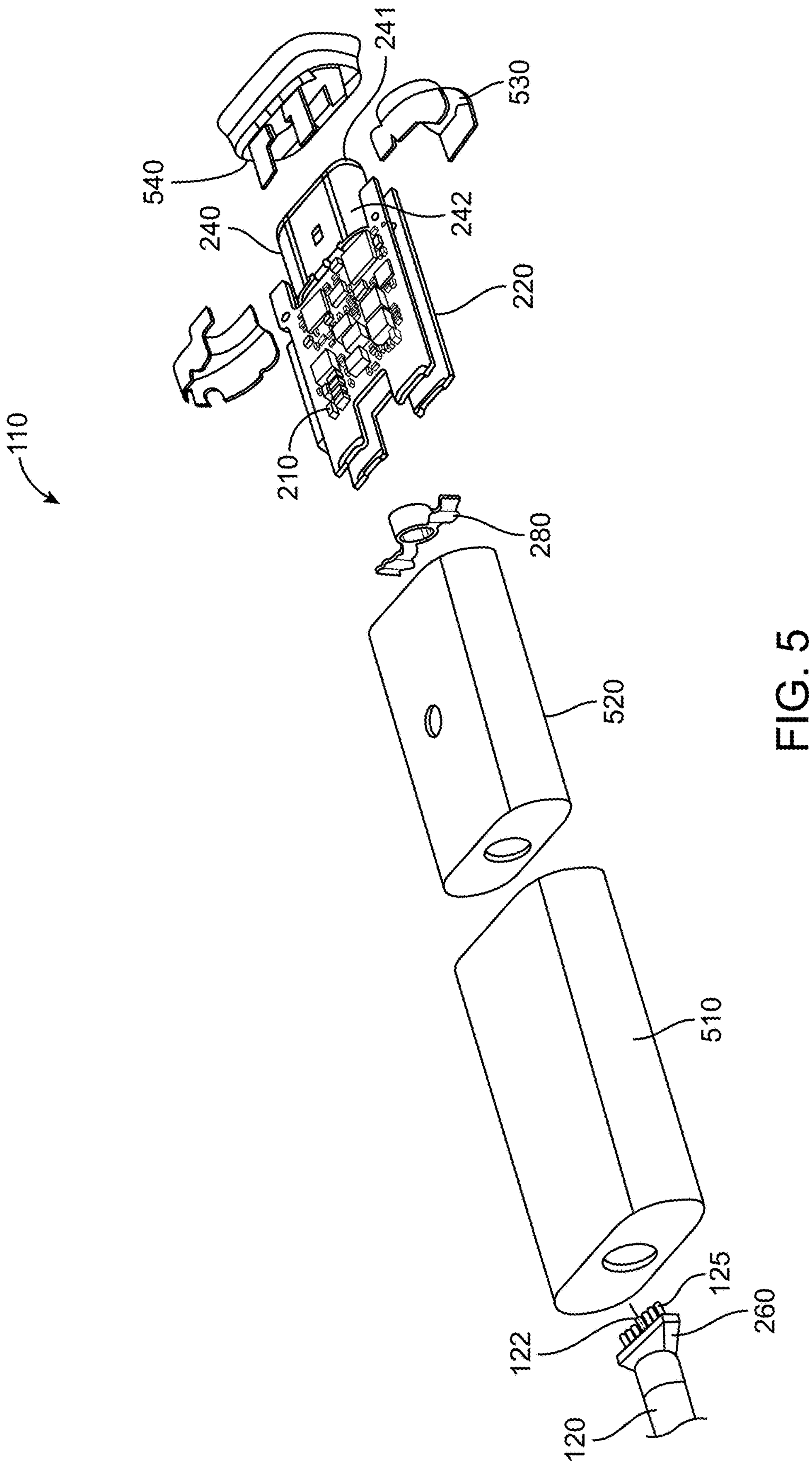
FIG. 5 is an exploded view of the connector of FIG. 2.

FIG. 5 is an exploded view of a connector for the adapter of FIG. 2. Terrace board 210, base board 220, flexible circuit board 230, and receptacle assembly 240 can be joined as shown above. Connector 110 can further include receptacle assembly 240, which can include shield 242 around housing 241 (shown in FIG. 4). Housing 241 can support contacts 244 (shown in FIG. 4.) Housing 241 can be formed by molding, injection molding, 3-D printing, or other process, and can be formed of plastic, nylon, glass nylon, or other material. Shield 242, standoffs 250, contacts 244, and crimp piece 280 can be formed of stainless steel, copper, or other conductive material. Shield 242, standoffs 250, and contacts 244 can be formed by stamping, deep drawing, forging, or other process. Shield 242, standoffs 250, and contacts 244 can be fully or partially plated or coated to prevent or reduce corrosion.

Wire comb 260 can be formed around conductors 125 and microcoax 122 of adapter cable 120. Wire comb 260 can be formed of urethane, latex, silicone, or other polymer or potting material, and can be formed by molding or other process. Components 410 (shown in FIG. 4) can be encapsulated in epoxy, urethane, latex, silicone, or other polymer or potting material.

Shield 520 can be positioned around the rigid-flex structure. Shield 520 can be formed by plating, vapor deposition, stamping, deep drawings, or other process. Shield 520 can be formed of copper or a copper alloy. Clamshell pieces 530 and faceplate 540 can be attached to receptacle assembly 240. Clamshell pieces 530 and faceplate 540 can be formed of stainless steel or other material, and can be formed by stamping, forging, metal-injection molding, or other process. Boot 510 can be positioned over shield 520 to provide a protective surface that can be grasped by a user during connection. Boot 510 can be formed of polycarbonate or other material and can be formed by molding or other process. Adapter cable 120 can be covered with a soft braiding that can be formed of polyethylene, polyethylene terephthalate, polypropylene, or other material.

In the above example, terrace board 210 and base board 220 can be spaced apart and attached to each other using receptacle assembly 240 and crimp piece 280. Various other structures can be used to space and attach terrace board 210 and base board 220. Examples are shown in the following figures.

Figure 6A:
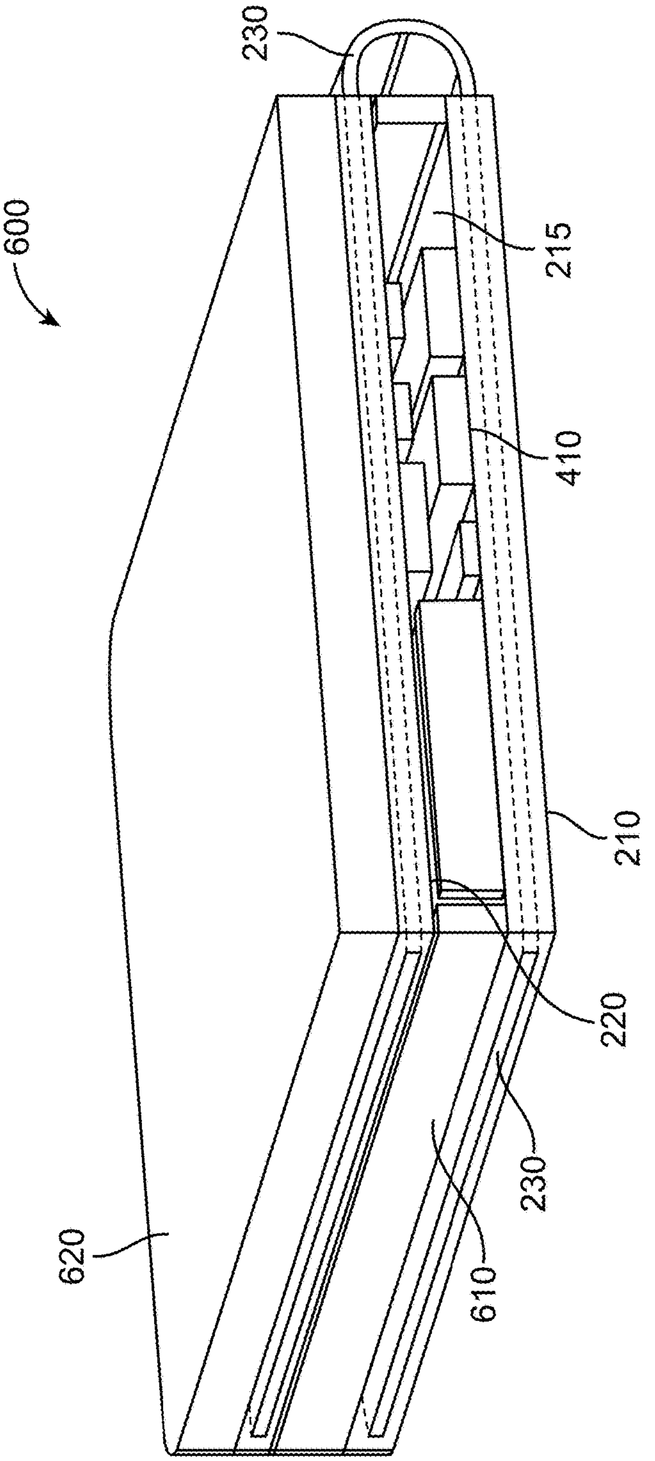
Figure 6B:
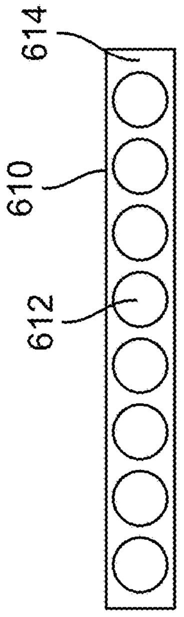
FIG. 6B is a cross section of the interposer.

FIG. 6A illustrates a portion of an electronic device comprising a rigid-flex structure and an interposer according to an embodiment of the present invention, while FIG. 6B is a cross section of the interposer. FIG. 6A illustrates a portion 600 of an electronic device including a rigid-flex structure formed of first or terrace board 210 and second or base board 220 joined by flexible circuit board 230. Interposer 610 can set a vertical spacing between terrace board 210 and base board 220. Components 410 can be placed in terraced space 215 between terrace board 210 and base board 220. These components 410 can be encapsulated or unencapsulated. Other components (not shown) can be placed on top of terrace board 210 and encapsulated by encapsulation or molding 620. Other components 410 can be placed on a bottom side of base board 220 and they can be either encapsulated or unencapsulated. Encapsulation or molding 620 can be formed of epoxy, room-temperature-vulcanizing silicone or other silicone or other elastomeric material, urethane, latex, or other potting or other material.

As shown in this example, vertical spacing between base board 220 and terrace board 210 of a space-saving rigid-flex structure can be controlled using interposers, such as interposer 610. These interposers can be used when the space-saving rigid-flex structure is incorporated into a connector or other type of electronic device. Interposer 610 can include a number of pins that are soldered at a first end to a top of the base board 220 and at a second end to a bottom of the terrace board 210. The pins can be formed of copper, stainless steel, or other conducive material, and can be housed in a plastic molding, an FR-4 board, or other dielectric material. For example, FIG. 6B illustrates a cross section of interposer 610. Interposer 610 can include pins 612 in molding, housing, or board 614.

Interposer 610 can be placed at various locations in portion 600 of an electronic device. As an example, where flexible circuit board 230 extends from a first edge of base board 220 to a first edge of terrace board 210, interposer 610 can be located along a second edge of base board 220 and a second edge of terrace board 210. Interposer 610 can be at or near an outside edge of base board 220 and terrace board 210 and can partially or completely encircle all or part of terraced space 215. In these and other embodiments of the present invention, more than one interposer can be used. For example, a first interposer 610 can be located along the first edge of base board 220 and the first edge of terrace board 210, while a second interposer can be located along the second edge of base board 220 and the second edge of terrace board 210. In these and other embodiments of the present invention, interposer 610 can be placed along or near an outside edge of base board 220 and extend to terrace board 210 and be located along or near an outside edge of each board. Interposers 610 can also be routed through terraced space 215 away from the edges, for example to provide shielding for electronic components in terraced space 215.

Interposer 610 can form a ground path between base board 220 and terrace board 210. Interposer 610 can also or instead convey a power supply, data signals, bias lines, or other voltages or currents between base board 220 and terrace board 210. It can be advantageous to use pins 612 of interposer 610 to convey a power supply given the relatively low-impedance of pins 612. When a power supply such as ground is conveyed by interposer 610, interposer 610 can act as a shield for electronic components 410 in terraced space 215. In these and other embodiments of the present invention, when signals are conveyed using interposers 610, it can be desirable to include redundant paths to compensate for pin breakage. The desirability of this redundancy highlights the usefulness provided by the ability to convey signals using flexible circuit board 230 while relegating the interposers to providing ground paths and shielding.

Figure 7:
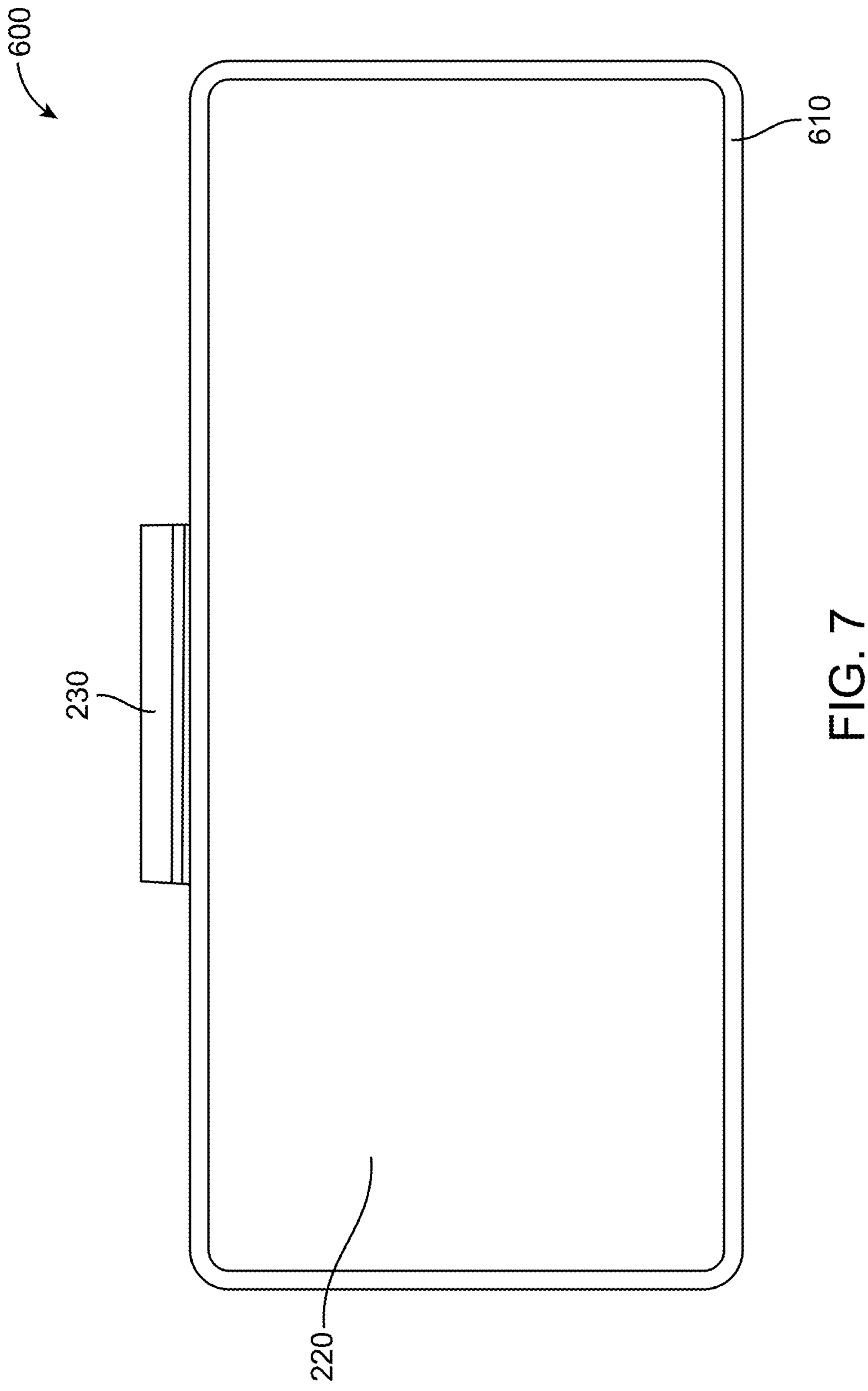
FIG. 7 illustrates a top view of a portion of an electronic device comprising a rigid-flex structure and an interposer according to an embodiment of the present invention.

FIG. 7 illustrates a top view of a portion of an electronic device comprising a rigid-flex structure and an interposer according to an embodiment of the present invention. Portion 600 can include a rigid-flex structure formed of first or terrace board 210 (shown in FIG. 6A) and second or base board 220 joined by flexible circuit board 230. Interposer 610 can circumferentially surround a top surface of base board 220.

In these and other embodiments of the present invention, it can be desirable to provide structures that can determine the spacing between and attach base board 220 to terrace board 210 where the structures consume a reduced amount of area on surfaces of base board 220 and terrace board 210. It can also be desirable that these structures be simple and readily modified. It can also be desirable that these structures provide for shielding between components in terraced space 215. An example is shown in the following figure.

Figure 8:
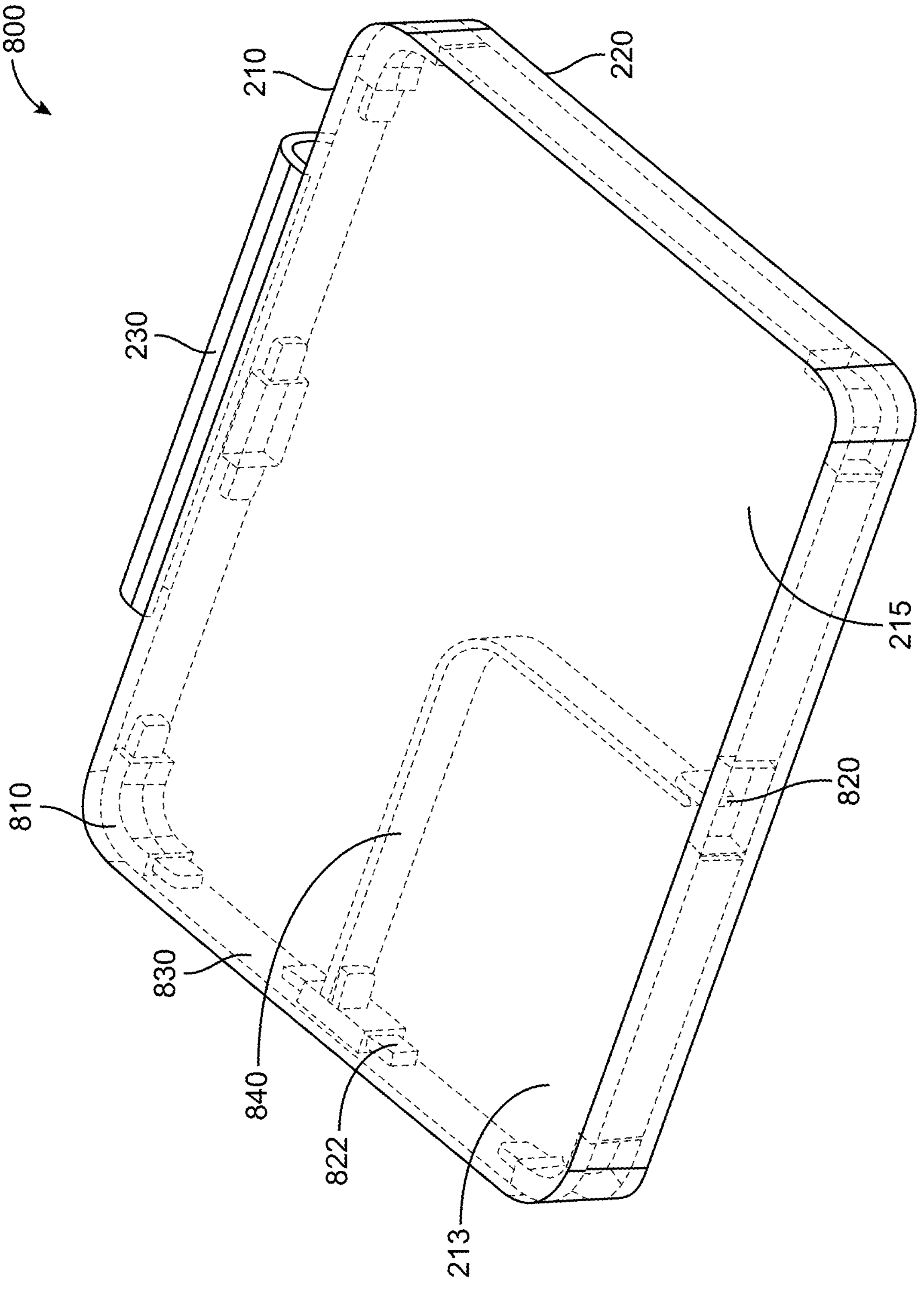
FIG. 8 illustrates space saving structures for setting the spacing between and attaching a base board to a terrace board according to an embodiment of the present invention.

FIG. 8 illustrates space saving structures for setting the spacing between and attaching a base board to a terrace board according to an embodiment of the present invention. In this example, vertical spacing between terrace board 210 and base board 220 of electronic device portion 800 can be controlled using various posts, such as corner posts 810 and side posts 820, along with shield structures 830 and 840. Corner posts 810 can extend between base board 220 and terrace board 210 and can be placed in their respective corners of base board 220 and terrace board 210. Side posts 820 can be placed along sides of base board 220 and terrace board 210. Corner posts 810 and side posts 820 can be soldered or attached to base board 220 and terrace board 210 using surface-mount technology or other technique. Shield structures 830 can extend between two of either side posts 820 or corner posts 810 to provide shielding for some or all of terraced space 215. Shield structures 840 can providing shielding for portions of terraced space 215, for example to form region 213. In these and other embodiments of the present invention, shield structures 830 and shield structures 840 can be thin thereby providing a space-efficient shield. In these and other embodiments of the present invention, shield structures 830 and shield structures 840 can provide ground paths between base board 220 and terrace board 210. Shield structures 830 and shield structures 840 can be soldered to corner posts 810 and side posts 820 at locations 822. Shield structures 830 and shield structures 840 can be soldered to base board 220 and terrace board 210.

The space-saving rigid-flex structures used in these and other embodiments of the present invention can be formed in various ways. For example, flexible circuit board 230 can include copper or other conductive layers that can be patterned, each on one side of a polyimide or other flexible layer. These layers can extend through base board 220 and terrace board 210. Base board 220 and terrace board 210 can each have additional layers above and below the flexible circuit board layers. Base board 220 and terrace board 210 can have the same or different layers as compared to each other and they can have the same or different layers on each side of the layers of flexible circuit board 230. For example, base board 220 and terrace board 210 can have FR-4, fiberglass, prepreg, or other dielectric layers above, below, or both above and below the layers of flexible circuit board 230. These layers can support copper or other conductive layers. Base board 220 and terrace board 210 can thus be built up of alternating dielectric and conductive layers. Flexible circuit board 230 can have a coverlay over the conductive layers of the flexible circuit board, where the coverlay is attached to the conductive layers of flexible circuit board 230 with an adhesive. Base board 220 and terrace board 210 can have layers of soldermask over their top and bottom conductive layers. Vias can be located throughout the space-saving rigid-flex board to provide signal routing. The additional dielectric layers and conducive layers can be formed as base board 220 and terrace board 210 during manufacturing. In these and other embodiments of the present invention, the additional dielectric layers and conducive layers can be formed over layers of flexible circuit board 230, and then routed to form flexible circuit board 230. Following the routing, the coverlay can be applied to the top and bottom of flexible circuit board 230.

In these and other embodiments of the present invention, base board 220 and terrace board 210 can be formed of FR-4 layers having plated metallized layers etched to form contacts and traces. These and other embodiments of the present invention can include a base board 220 and a terrace board 210 that include metalized or conductive layers, prepreg layers, FR-4 layers, and other layers.

In these and other embodiments of the present invention, the connectors, such as connector 110 for adapter 100, can be manufactured in various ways. For example, the space-saving rigid-flex structure can be placed in an open position, where base board 220, flexible circuit board 230, and terrace board 210 lie flat and parallel to each other (all shown in FIG. 4.) Components 410 (shown in FIG. 4) can be attached to either or both sides of base board 220 and terrace board 210. Receptacle assembly 240 (shown in FIG. 4) can be attached to terrace board 210. Conductors of adapter cable 120 (shown in FIG. 3) can be attached to contacts or pads 116, 117, and 118 on terrace board 210. One or more sides of either or both base board 220 and terrace board 210 can be encapsulated to prevent damage during further assembly. Base board 220 can be folded over terrace board 210 and receptacle assembly 240 can be attached to base board 220. Crimp piece 280 and its standoffs 282 (both shown in FIG. 3) can be attached to ends of base board 220 and terrace board 210. A faceplate 540, clamshell pieces 530, and shield 520, and boot 510 can be positioned or formed around receptacle assembly 240, crimp piece 280, and the space-saving rigid-flex structure including base board 220, terrace board 210, and flexible circuit board 230.

Additional space saving can be achieved by utilizing space-saving side ground contacts in a connector. For example, where connector 110 receives a Lightning™ input, these space-saving side ground contacts can help to reduce a width of the receptacle. These space-saving side ground contacts can be reinforced with tabs that extend along an outward facing side of the side ground contacts. These tabs can be plastic, nylon, or other materials. The tabs can limit a possible deflection of the side ground contacts, thereby allowing the receptacle to have a reduced width.

In various embodiments of the present invention, receptacle shields, contacts, and other conductive portions of a connector receptacle can be formed by stamping, metal-injection molding, machining, micro-machining, 3-D printing, or other manufacturing process. The conductive portions can be formed of stainless steel, steel, copper, copper titanium, phosphor bronze, or other material or combination of materials. They can be plated or coated with nickel, gold, or other material. The nonconductive portions, such as housings and other structures can be formed using injection or other molding, 3-D printing, machining, or other manufacturing process. The nonconductive portions can be formed of silicon or silicone, rubber, hard rubber, plastic, nylon, liquid-crystal polymers (LCPs), ceramics, or other nonconductive material or combination of materials. The printed circuit boards used can be formed of FR-4 or other material.

Embodiments of the present invention can provide adapters that can connect various types of devices, such as portable computing devices, tablet computers, desktop computers, laptops, all-in-one computers, wearable computing devices, cell phones, smart phones, media phones, storage devices, portable media players, navigation systems, monitors, power supplies, video delivery systems, adapters, remote control devices, chargers, and other devices. These connector adapters can provide interconnect pathways for signals that are compliant with various specifications or standards such as one of the Universal Serial Bus (USB) specification including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention can provide adapters that can be used to provide a reduced set of functions for one or more of these specifications or standards. In various embodiments of the present invention, these interconnect paths provided by these adapters can be used to convey power, ground, signals, test points, and other voltage, current, data, or other information.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An adapter comprising:

a cable having a first end and a second end;

a first connector attached to the first end of the cable;

a second connector attached to the second end of the cable, wherein the second connector comprises:

a first printed circuit board;

a second printed circuit board;

a flexible circuit board joining the first printed circuit board and the second printed circuit board such that the first printed circuit board is aligned over the second printed circuit board and the flexible circuit board joins a first edge of the first printed circuit board to a first edge of the second printed circuit board, wherein the flexible circuit board extends through the first printed circuit board and the second printed circuit board; and a shield, the shield comprising a plurality of corner posts, each positioned between a corner of the first printed circuit board and a corresponding corner of the second printed circuit board, and a plurality of shield structures, each extending from a corner post.

2. The adapter of claim 1 wherein the flexible circuit board forms a 180-degree connection between the first printed circuit board and the second printed circuit board.

3. The adapter of claim 2 further comprising an interposer attached to the first printed circuit board along a second edge and the second printed circuit board along a second edge, wherein the interposer comprises a ground path between the first printed circuit board and the second printed circuit board.

4. The adapter of claim 2 further comprising an interposer attached to the first printed circuit board along an outer edge and the second printed circuit board along an outer edge, wherein the interposer comprises a ground path between the first printed circuit board and the second printed circuit board.

5. The adapter of claim 2 wherein the shield further comprises a first side post extending from the first edge of the first printed circuit board to the first edge of the second printed circuit board, a second side post extending from a second edge of the first printed circuit board to a second edge of the second printed circuit board, and a first shield structure in the plurality of shield structures extending from the first side post to the second side post.

6. The adapter of claim 2 further comprising a first plurality of electronic components on a top side of the second printed circuit board.

7. The adapter of claim 6 further comprising a second plurality of electronic components on a top side of the first printed circuit board, wherein the second plurality of electronic components are encapsulated.

8. The adapter of claim 1 wherein the first connector is a connector insert and the second connector is a connector receptacle.

9. The adapter of claim 8 wherein the connector insert is a Universal Serial Bus Type-C connector insert and the connector receptacle is a Lightning™ connector receptacle.

10. An electronic device comprising:

a rigid-flex structure comprising:

a first printed circuit board;

a second printed circuit board positioned under and aligned with the first printed circuit board such that a bottom side of the first printed circuit board faces a top side of the second printed circuit board;

a flexible circuit board joining the first printed circuit board and the second printed circuit board and conveying signals from the first printed circuit board to the second printed circuit board;

a first plurality of electronic components on a top side of the first printed circuit board, wherein the first plurality of electronic components are encapsulated;

a second plurality of electronic components on a top side of the second printed circuit board, wherein the second plurality of electronic components are not encapsulated, and wherein the flexible circuit board forms a 180-degree connection between the first printed circuit board and the second printed circuit board; and a shield, the shield comprising a plurality of corner posts, each positioned between a corner of the first printed circuit board and a corresponding corner of the second printed circuit board, and a plurality of shield structures, each extending from a corner post.

11. The electronic device of claim 10 wherein the flexible circuit board extends from a first edge of the second printed circuit board to a second edge of the first printed circuit board.

12. The electronic device of claim 11 wherein the flexible circuit board extends through the second printed circuit board and the first printed circuit board.

13. The electronic device of claim 10 further comprising a third plurality of electronic components on a bottom side of the first printed circuit board, wherein the third-plurality of electronic components are not encapsulated.

14. The electronic device of claim 10 wherein the electronic device is a connector receptacle.

15. A connector comprising:

a rigid-flex structure comprising:

a first printed circuit board;

a second printed circuit board positioned under and aligned with the first printed circuit board; and a flexible circuit board joining the first printed circuit board and the second printed circuit board and conveying signals from the first printed circuit board to the second printed circuit board; and a receptacle assembly attached to the second printed circuit board and having a housing with a passage to accept a corresponding connector, and a shield around the housing and having lateral standoffs extending away from the passage, the lateral standoffs having upward pins extending upward and downward pins extending downward, wherein the upward pins fit in corresponding openings in the first printed circuit board and the downward pins fit in corresponding openings in the second printed circuit board.

16. The connector of claim 15 wherein the flexible circuit board extends from a first edge of the second printed circuit board to a second edge of the first printed circuit board.

17. The connector of claim 16 wherein a corresponding opening in the first printed circuit board for a first upward pin is extended in a lateral direction such that the first upward pin is inserted in the corresponding opening during assembly.

18. The connector of claim 17 further comprising a plurality of contacts extending from the passage to a top side of the second printed circuit board.

19. The connector of claim 18 wherein the connector is a connector receptacle.

* * * * *